(12) United States Patent
Ott

(10) Patent No.: US 6,777,946 B2
(45) Date of Patent: Aug. 17, 2004

(54) CELL BUFFER WITH BUILT-IN TEST

(75) Inventor: William E. Ott, Phoenix, AZ (US)

(73) Assignee: Honeywell International Inc., Morristown, NJ (US)

( * ) Notice: Subject to any disclaimer, the term of this patent is extended or adjusted under 35 U.S.C. 154(b) by 51 days.

(21) Appl. No.: 10/186,517

(22) Filed: Jul. 1, 2002

(65) Prior Publication Data
US 2004/0088629 A1 May 6, 2004

(51) Int. Cl.[7] .................. G01N 27/416; G01R 31/08
(52) U.S. Cl. .................... 324/434; 324/527
(58) Field of Search .................. 324/434, 522, 324/523, 429, 433, 527, 533; 320/127, 128, 134, 135, 136; 429/13, 22, 90, 91, 92; 340/636.1, 636.21

(56) References Cited

U.S. PATENT DOCUMENTS

| | | | | |
|---|---|---|---|---|
| 3,812,303 A | * | 5/1974 | Stewart | 379/27.01 |
| 4,525,663 A | * | 6/1985 | Henry | 323/280 |
| 5,914,606 A | * | 6/1999 | Becker-Irvin | 324/434 |
| 5,940,052 A | * | 8/1999 | Xia et al. | 345/74.1 |
| 6,111,529 A | * | 8/2000 | Maulik et al. | 341/120 |
| 6,163,862 A | * | 12/2000 | Adams et al. | 714/718 |
| 6,353,334 B1 | * | 3/2002 | Schultz et al. | 326/82 |

* cited by examiner

Primary Examiner—N. Le
Assistant Examiner—Hoai-An D. Nguyen

(57) ABSTRACT

A cell buffer with built-in testing mechanism is provided. The cell buffer provides the ability to measure voltage provided by a power cell. The testing mechanism provides the ability to test whether the cell buffer is functioning properly and thus providing an accurate voltage measurement. The testing mechanism includes a test signal-provider to provide a test signal to the cell buffer. During normal operation, the test signal is disabled and the cell buffer operates normally. During testing, the test signal is enabled and changes the output of the cell buffer in a defined way. The change in the cell buffer output can then be monitored to determine if the cell buffer is functioning correctly. Specifically, if the voltage output of the cell buffer changes in a way that corresponds to the provided test signal, then the functioning of the cell buffer is confirmed. If the voltage output of the cell buffer does not change correctly, then the cell buffer is known not to be operating correctly. Thus, the built in testing mechanism provides the ability to quickly and accurately determine if the cell buffer is operating correctly. Furthermore, the testing mechanism provides this functionality without requiring excessive device size and complexity.

20 Claims, 3 Drawing Sheets

CELL BUFFER WITH BUILT-IN TEST

STATEMENT OF GOVERNMENT INTEREST

The U.S. Government has a paid-up license in this invention and the right in limited circumstances to require the patent owner to license to others on reasonable terms as provided for by the terms of Contract No. NAS9-20000 awarded by the National Aeronautics and Space Administration (NASA), International Fuel Cells Corp. Subcontract No. 310923 09.

BACKGROUND OF THE INVENTION

1. TECHNICAL FIELD

This invention generally relates to electronic systems, and more specifically relates to testing of electronic systems.

2. BACKGROUND ART

Modern life is becoming more dependent upon electronic systems. Electronics devices have evolved into extremely sophisticated devices, and may be found in many different applications. As electronics become more integrated into daily life, their reliability becomes a greater and greater necessity. In order to ensure sufficient reliability it is necessary to thoroughly monitor and test electronic systems.

One particular type of electronic component that are increasingly important are power cells. Power cells provide the power needed to run many types of systems. There are many different types of power cells, with each type having advantages and disadvantages. One example of a power cell includes conventional batteries that simply store electricity. Another example of power cells include advanced fuel cells that use different fuels such as hydrogen or methane to actually generate electricity. In many applications, multiple power cells are combined together in series and in parallel to provide the necessary voltage and amperage needed to power a particular system. For example, a string of 32 one-volt power cells can be combined to make one 32 volt power source.

In many power cells, it is critical that the voltage provided by the power cell be accurately monitored. In some cases, increases or decreases in voltage can indicate a severe problem in the power cell, and in some cases can result in critical damage to the overall system. Without a way to accurately monitor the voltage provided by power cells, the reliability and safety of these systems cannot be assured.

Thus, what is needed is an improved method and mechanism for monitoring power cell voltage.

DISCLOSURE OF INVENTION

The present invention provides a cell buffer with built in testing mechanism. The cell buffer provides the ability to measure voltage provided by a power cell. The testing mechanism provides the ability to test whether the cell buffer is functioning properly and thus providing an accurate voltage measurement.

The testing mechanism includes a test signal provider to provide a test signal to the cell buffer. During normal operation, the test signal is disabled and the cell buffer operates normally. During testing, the test signal is enabled and changes the output of the cell buffer in a defined. The change in the cell buffer output can then be monitored to determine if the cell buffer is functioning correctly. Specifically, if the voltage output of the cell buffer changes in a way that corresponds to the provided test signal, then the functioning of the cell buffer is confirmed. If the voltage output of the cell buffer does not change correctly, then the cell buffer is known not to be operating correctly. Thus, the built in testing mechanism provides the ability to quickly and accurately determine if the cell buffer is operating correctly. Furthermore, the testing mechanism provides this functionality without requiring excessive device size and complexity.

The foregoing and other objects, features and advantages of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

The present invention provides a cell buffer with built in testing mechanism. The cell buffer provides the ability to measure voltage provided by a power cell. The testing mechanism provides the ability to test whether the cell buffer is functioning properly and thus providing an accurate voltage measurement.

The testing mechanism includes a test signal provider to provide a test signal to the cell buffer. During normal operation, the test signal is disabled and the cell buffer operates normally. During testing, the test signal is enabled and changes the output of the cell buffer in a defined way. The change in the cell buffer output can then be monitored to determine if the cell buffer is functioning correctly. Specifically, if the voltage output of the cell buffer changes in a way that corresponds to the provided test signal, then the functioning of the cell buffer is confirmed. If the voltage output of the cell buffer does not change correctly, then the cell buffer is known not to be operating correctly. Thus, the built in testing mechanism provides the ability to quickly and accurately determine if the cell buffer is operating correctly. Furthermore, the testing mechanism provides this functionality without requiring excessive device size and complexity.

The cell buffer and test mechanism can be used in any application where a common mode voltage needs to be eliminated. The cell buffer and testing mechanism is particularly applicable to measuring voltage in the presence of a common mode voltage as in a multi-cell power system. The cell buffer eliminates the common mode voltage and produces a single ended common ground voltage proportional to the cell voltage. The single ended common ground voltage can then be measured to determine if the power cell is operating correctly. The testing mechanism thus provides the ability to test whether the cell buffer is accurately eliminating the common mode voltage and whether the testing mechanism is operating correctly.

The cell buffer can be used to monitor and test any type of power cell. For example, it can be used to monitor conventional batteries (such as lithium ion batteries), fuel cells (such as hydrogen fuel cells) and solar cells. In all these cases, the cell buffer can be used to eliminate common mode voltage to facilitate monitoring of a particular cell.

Figure 1:
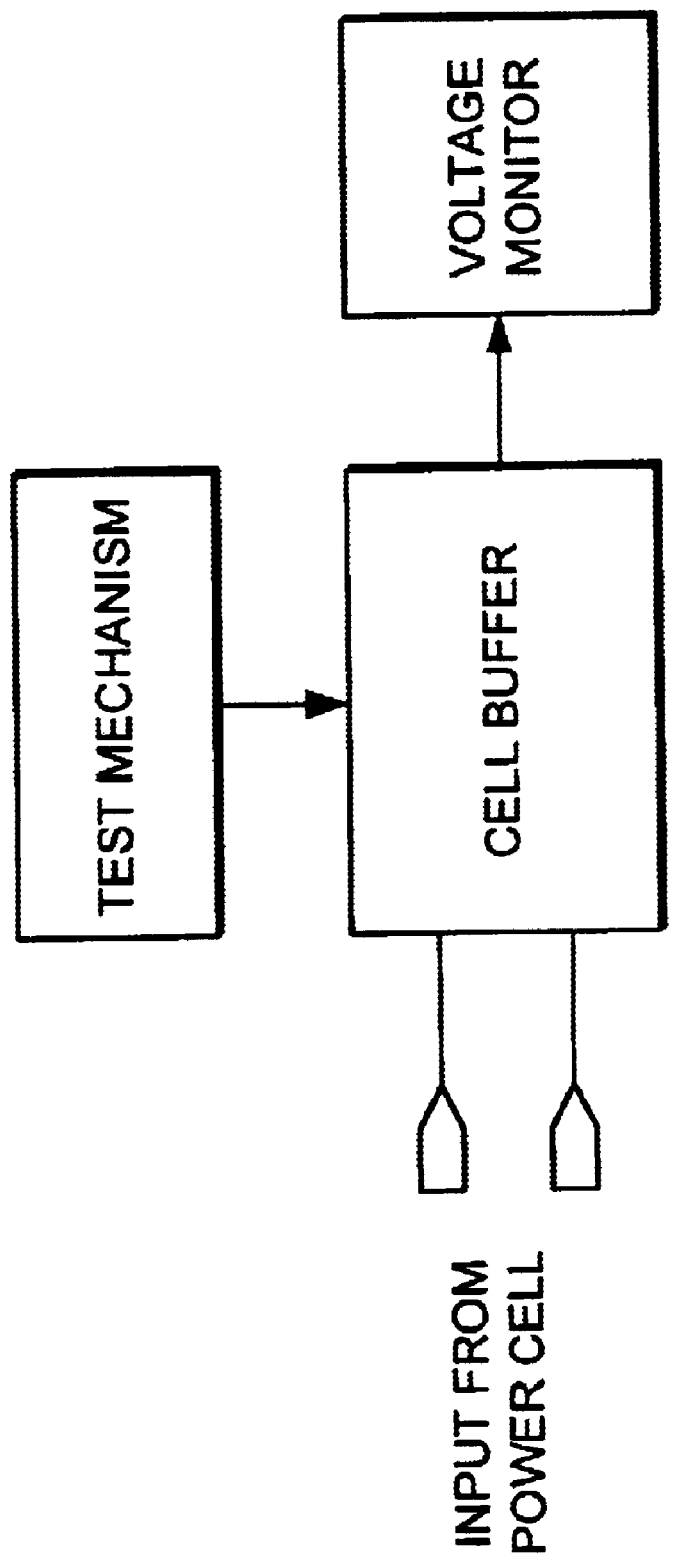
FIG. 1 is a schematic view of a cell buffer with a testing mechanism.

Turning now to FIG. 1, an exemplary cell buffer, voltage monitor and test mechanism is illustrated schematically. The cell buffer receives a differential input from the power cell it is configured to monitor. The cell buffer eliminates the common mode voltage from the power cell and produces a single ended common ground voltage proportional to the differential voltage. That common ground voltage is then provided to the voltage monitor, which monitors the voltage to determine if the power cell is operating properly.

The testing mechanism provides the ability to test whether the cell buffer is operating properly. The testing mechanism provides the ability to selectively add a test signal to the cell buffer. During normal operation, the test signal is disabled, providing essentially zero volts, and the cell buffer operates normally. During testing, the test signal is enables and changes the output of the cell buffer in a defined way. The voltage monitor determines if there is a corresponding change in the output of the cell buffer. Specifically, if the cell buffer output changes in a way that corresponds to the provided test signal, then the correct functioning of the cell buffer is confirmed. If the voltage output of the cell buffer does not change correctly, then the cell buffer is known not to be operating correctly. Thus, the testing mechanism provides the ability to quickly and accurately determine if the cell buffer is operating correctly.

The voltage monitor provides the ability to monitor the output of the cell buffer and can be implemented in any suitable manner. For example, the voltage monitor can comprise a multiplexer that selects which voltage to monitor from a plurality of cell buffers, and an analog to digital converter that converts the selected voltage into a digital signal, where it can be monitored by a microprocessor.

Figure 2:
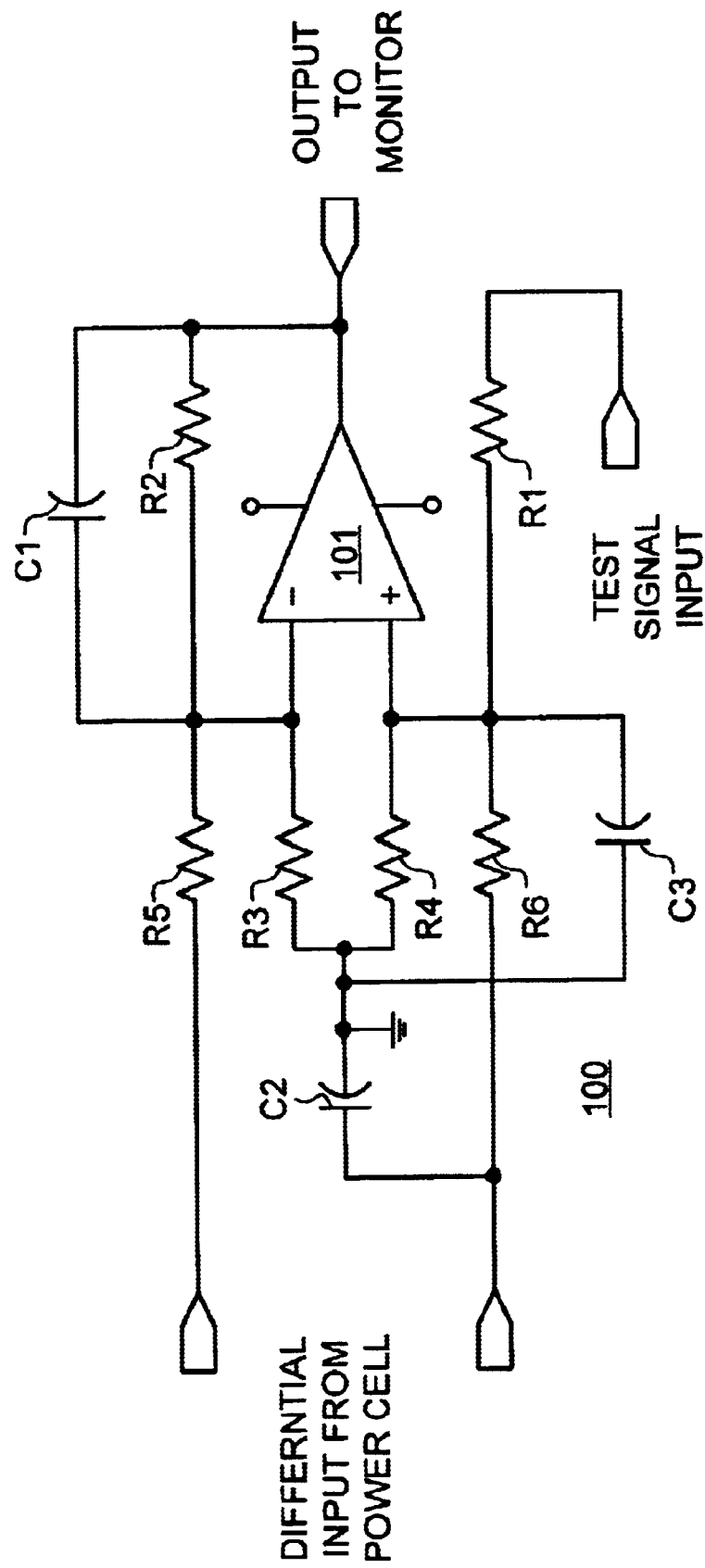
FIG. 2 is a schematic view of a cell buffer.

Turning now to FIG. 2, a preferred embodiment of a cell buffer 100 is illustrated schematically. The cell buffer 100 includes an operational amplifier 101, resistors R1, R2, R3, R4, R5 and R6, and capacitors C1, C2 and C3. The cell buffer 100 receives a differential input from a power cell, and outputs to a voltage monitor. The cell buffer 100 further includes a Test Signal Input for receiving a test signal voltage.

During normal operation, the test signal is disabled, providing essentially zero volts to the resistor R1, and the cell buffer operates by receiving a differential input from the power cell it is configured to monitor. The cell buffer eliminates the common mode voltage from the power cell and produces a single ended common ground voltage proportional to the differential voltage. That common ground voltage is then provided to the voltage monitor, which monitors the voltage to determine if the power cell is operating properly.

During testing, the test signal is enabled, adding a positive or negative voltage to the resistor R1. The addition of the test signal changes the operation of the cell buffer. Specifically, the produced single ended common ground voltage is changed by a value that corresponds to the voltage of the test signal. The modified voltage is then outputted to the voltage monitor. By evaluating the modified voltage and comparing to the unmodified voltage, the voltage monitor can determine if the cell buffer is operating correctly. Thus, the testing mechanism provides the ability to quickly and accurately determine if the cell buffer is operating correctly.

The resistors R1–R6 are preferably chosen to properly adjust the gain of the cell buffer. In particular, they are preferably chosen to bring the common mode voltage down to a level that is suitable for the operational amplifier and produces an output proportional to the differential input suitable for monitoring.

As one example, the resistors R1–R6 are selected to provide an output voltage that is twice the differential input voltage plus the test signal voltage ($V_{OUT}=2V_{IN}+V_{TEST\_SIGNAL}$). This can be accomplished by choosing resistor values of and R1=300 k, R2=300 k, R3=187 k, R4=187 k, R5=150 k and R6=150 k. These resistor values provide a large input resistance, and provide the gain needed to properly buffer the cell voltage and provide for the desired response to a test signal input. Of course, this is just one example of the many different resistor combinations that could be used to implement the cell buffer with built in test.

It should also be noted that instead of locating the test signal input at R1, it could instead be located at R3 or R4. In particular, R3 or R4 would be disconnected from ground, and the test signal input applied in its place. R1 would then be connected to ground. Such an implementation may not result in the output being 2 times the input plus the test signal, but it still may be desirable for some applications.

The capacitors C1 and C3 are to provide filtering of high frequency noise. The capacitor C2 is on the input lead to provide ESD protection. In one implementation, the capacitors C1, C2, and C3 have capacitance of 0.039 microfarads. In single cell applications, it would also be desirable to add a fourth capacitor equal in value to C2 between the upper differential input and ground for additional ESD protection. In multi-cell applications, this capacitance can be provided by the C2 capacitor on the adjacent cell buffer.

Figure 3:
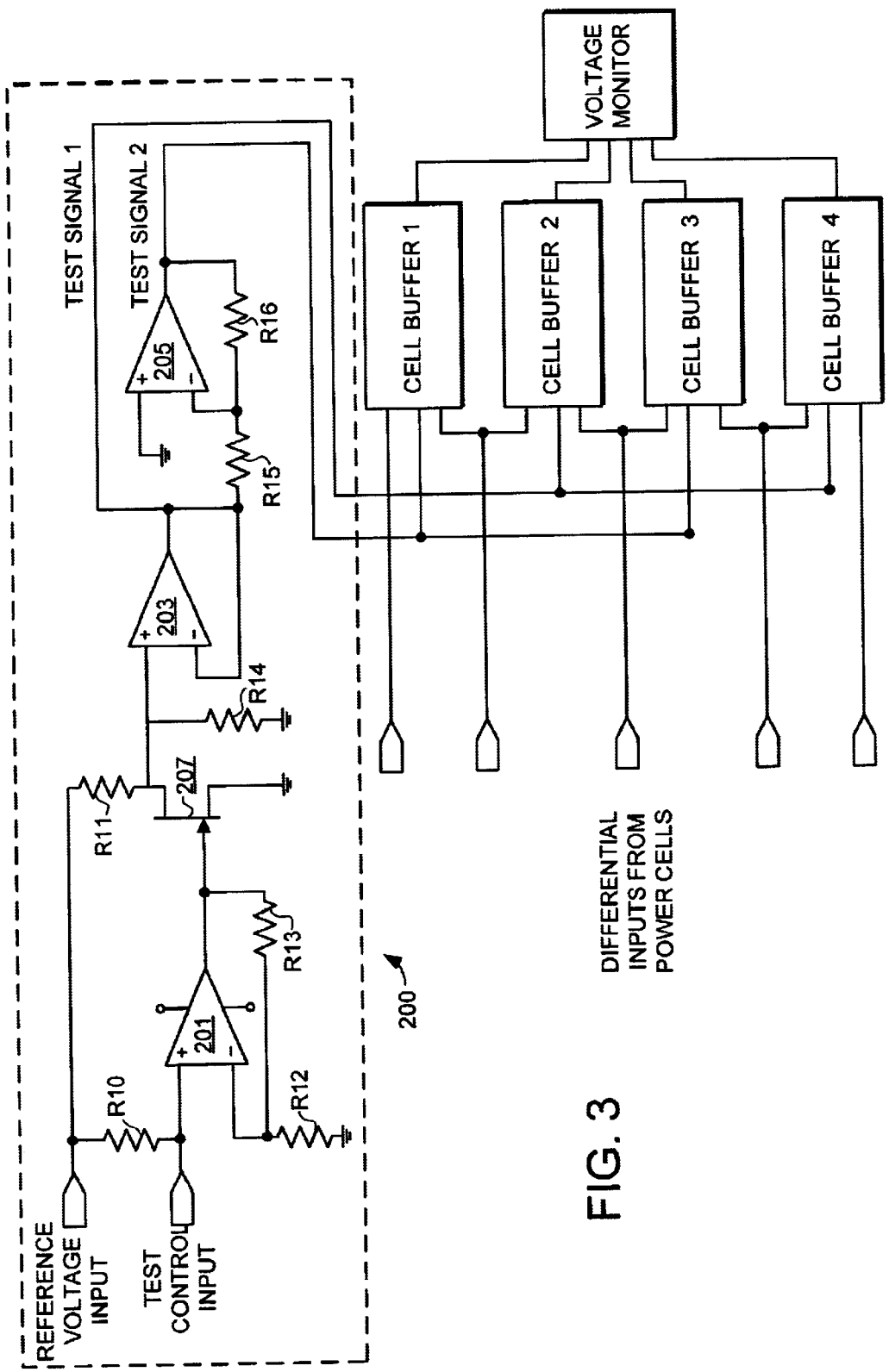
FIG. 3 is a schematic view of a test signal provider with four cell buffers.

Turning now to FIG. 3, a test signal provider 200 is illustrated with a bank of four cell buffers and a voltage monitor. The test signal provider 200 provides the test signal used to test whether the cell buffers are operating properly. During normal operation, the test signal is disabled, providing nearly zero volts, and the cell buffers operate by receiving the differential inputs from the power cell they are configured to monitor. During testing, the test signal provider 200 enables the test signal. The addition of the test signal changes the operation of the cell buffers. Specifically, the produced single ended common ground voltages are changed by a value that corresponds to the voltage of the test signal.

The test signal provider 200 comprises an operational amplifier 201, an n-channel MOSFET 207, an operational amplifier 203, an operational amplifier 205 and resistors R10, R11, R12, R13, R14, R15 and R16. The ten signal provider 200 receives a reference voltage input and a test control input, and outputs two test signals, test signal 1 and test signal 2. Test signal 1 and Test signal 2 are inputted into the cell buffers. Specifically, test signal 1 is inputted to cell buffers 2 and 4, and test signal 2 is inputted to cell buffers 1 and 3.

In one implementation, the resistors R10, R12, R13, R15 and R16 all comprise 10 k ohm resistors, while R11 comprises a 2490 ohm resistor and R14 comprises a 604 ohm resistor.

During normal mode, the test control input is high. This causes operational amplifier 201 to output high, turning on MOSFET 207. This causes the voltage at the positive input of operational amplifier 203 to be near zero volts which produces an output from operational amplifier 203 of nearly zero volts. Since resistors R15 and R16 are both 10 k ohm, operational amplifier 205 produces a gain of minus one, and in the normal mode its output is nearly zero volts.

During test mode, the test control input is low. This causes the operational amplifier 201 to output low, turning off MOSFET 207. This causes the voltage at the positive input of operational amplifier 203 to be the reference input voltage divided by the voltage divider of resistors R11 and R14. Operational amplifier 203 is connected as a non-inverting gain of one, and its output, Test Signal 1, is essentially this voltage. Operational amplifier 205 is connected as an inverting gain of one and its output, Test Signal 2, is essentially minus the reference input voltage divided by the resistors R11 and R14.

The test signal provider 200 provides two test signals of opposite polarity to allow for testing of the voltage monitor. Specifically, when enabled, test signal 1 will be approximately +0.98V and test signal 2 will be approximately −0.98V, when the reference input is 5.0V. Because these different test signals affect their cell buffers differently, they can be used to verify that the voltage monitor is testing the correct cell buffer.

The present invention thus provides a cell buffer with built in testing mechanism. The cell buffer provides the ability to measure voltage provided by a power cell. The testing mechanism provides the ability to test whether the cell buffer is functioning properly and thus providing an accurate voltage measurement.

The embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Many modifications and variations are possible in light of the above teaching without departing from the spirit of the forthcoming claims.

What is claimed is:

1. A cell buffer comprising:
   a) a differential input, the differential input receiving a differential voltage having a common mode voltage;
   b) an output, the output outputting a single ended common ground voltage proportional to the differential voltage; and
   c) a test signal input, the test signal input selectively receiving a test signal, the received test signal modifying the single ended common ground voltage outputted by the cell buffer in a way that corresponds to the test signal to facilitate testing of the cell buffer.

2. The cell buffer of claim 1 wherein the cell buffer includes an operational amplifier having a first input and a second input, and wherein the test signal input is coupled to the first input through a resistor.

3. The cell buffer of claim 1 wherein the cell buffer includes an operational amplifier having a first input and a second input, and wherein the test signal input is coupled to the first input through a first resistor and wherein the output of the cell buffer is coupled to the second input through a second resistor.

4. The cell buffer of claim 3 wherein the first resistor is substantially equal in resistive value to the second resistor.

5. The cell buffer of claim 4 wherein the cell buffer includes an operational amplifier having a positive input, a negative input and an operational amplifier output, a first resistor, a second resistor, a third resistor, a fourth resistor, a fifth resistor and a sixth resistor, the operational amplifier output coupled to the cell buffer output, the operational amplifier negative input coupled to the output through the second resistor, the operational amplifier positive input coupled to the test signal input through the first resistor, the first differential input coupled to the operational amplifier negative input through the fifth resistor, the second differential input coupled to the operational amplifier positive input through the sixth resistor, the operational amplifier negative input coupled to a ground through the third resistor and the operational amplifier positive input coupled to the ground through the fourth resistor.

6. The cell buffer of claim 5 wherein the first resistor and the second resistor have substantially equal resistance.

7. The cell buffer of claim 5 wherein the first resistor and the second resistor have substantially equal resistance and wherein the fifth resistor and the sixth resistor have substantially equal resistance.

8. The cell buffer of claim 1 wherein the cell buffer includes an operational amplifier having a positive input, a negative input and an operational amplifier output, a first resistor, a second resistor, a third resistor, a fourth resistor, a fifth resistor and a sixth resistor, the operational amplifier output coupled to the cell buffer output, the operational amplifier negative input coupled to the output through the second resistor, the operational amplifier positive input coupled to a ground through the first resistor, the first differential input coupled to the operational amplifier negative input through the fifth resistor, the second differential input coupled to the operational amplifier positive input through the sixth resistor, the operational amplifier negative input coupled the test signal input through the third resistor and the operational amplifier positive input coupled to the ground through the fourth resistor.

9. The cell buffer of claim 1 wherein the output is coupled to a voltage monitor, the voltage monitor monitoring the modified singled ended common ground voltage to test the cell buffer.

10. An apparatus comprising:
   a) a first cell buffer, the first cell buffer including:
      i) a first differential input, the first differential input receiving a first differential voltage from a first power cell, the first differential voltage having a first common mode voltage;
      ii) a first output, the first output outputting a first single ended common ground voltage proportional to the first differential voltage; and
      iii) a first test signal input, the first test signal input selectively receiving a first test signal, the received first test signal modifying the first single ended common ground voltage outputted by the first cell buffer in a way that corresponds to the first test signal to facilitate testing of the first cell buffer;
   b) a second cell buffer, the second cell buffer including:
      i) a second differential input, the second differential input receiving a second differential voltage from a second power cell, the second differential voltage having a second common mode voltage;
      ii) a second output, the second output outputting a second single ended common ground voltage proportional to the second differential voltage; and
      iii) a second test signal input, the second test signal input selectively receiving a second test signal, the received second test signal modifying the second single ended common ground voltage outputted by the second cell buffer in a way that corresponds to the second test signal to facilitate testing of the second cell buffer.

11. The apparatus of claim 10 further comprising a voltage monitor, the voltage monitor coupled the first output to monitor voltage from the first power cell and coupled the second output to monitor voltage from the second power cell, the voltage monitor selectively receiving the modified first singled ended common ground voltage to test the first cell buffer and the modified second singled ended common ground voltage to test the second cell buffer.

12. The apparatus of claim 10 wherein the first cell buffer includes a first operational amplifier having a first positive input and first negative input, and wherein the first test signal input is coupled to the first positive input through a first resistor, and wherein the second cell buffer includes a second operational amplifier having a second positive input and second negative input, and wherein the second test signal input is coupled to the second positive input through a second resistor.

13. The apparatus of claim 10 wherein the first cell buffer includes a first operational amplifier having a first positive input, a first negative input and a first output, and where the first test signal input is coupled to the first positive input through a first resistor and wherein the first output is coupled to the first negative input through a second resistor, and wherein the second cell buffer includes a second operational amplifier having a second positive input, second negative input and a second output, and wherein the second test signal input is coupled to the second positive input through a third resistor, and wherein the second output is coupled to the second negative input through a fourth resistor.

14. The apparatus of claim 13 wherein first and second resistors have substantially equal resistance and wherein the third and fourth resistors have substantially equal resistance.

15. The apparatus of claim 10 wherein first and second differential input share an input node.

16. The apparatus of claim 10 wherein first test signal comprises a positive voltage test signal and wherein the second test signal comprises a negative voltage test signal.

17. An apparatus comprising:
a) a differential input, the differential input receiving a differential voltage from a power cell having a common mode voltage;
b) an output, the output outputting a single ended common ground voltage proportional to the differential voltage; and
c) a test signal input, the test signal input selectively receiving a test signal;
d) a voltage monitor, the voltage monitor monitoring the modified signal ended common ground voltage to test the cell buffer;
e) an operational amplifier having a positive input and a negative input, and an operational amplifier output,
f) a first resistor, wherein the test signal input is coupled to the positive input through the first resistor; and
g) a second resistor, wherein the operational amplifier output is coupled to the negative input through a second resistor, wherein the received test signal modifies the single ended common ground voltage outputted by the cell buffer in a way that corresponds to the test signal.

18. The apparatus of claim 17 wherein the first resistor and the second resistor have substantially equal resistance.

19. The apparatus of claim 17 further comprising a third resistor, a fourth resistor, a fifth resistor and a sixth resistor, the first differential input coupled to the operational amplifier negative input through the fifth resistor, the second differential input coupled to the operational coupled to the ground through the sixth resistor, the operational amplifier negative input coupled to the ground through the third resistor and the operational amplifier positive input coupled to the ground through the fourth resistor.

20. The apparatus of claim 19 wherein the third resistor and the fourth resistor have substantially equal resistance.

* * * * *